US008476647B2

(12) United States Patent
Bratkovski et al.

(10) Patent No.: US 8,476,647 B2
(45) Date of Patent: *Jul. 2, 2013

(54) SILICON-GERMANIUM, QUANTUM-WELL, LIGHT-EMITTING DIODE

(75) Inventors: Alexandre M. Bratkovski, Mountain View, CA (US); Viatcheslav Osipov, E. Palo Alto, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/259,455

(22) PCT Filed: Sep. 25, 2009

(86) PCT No.: PCT/US2009/058373
§ 371 (c)(1),
(2), (4) Date: Sep. 23, 2011

(87) PCT Pub. No.: WO2011/037574
PCT Pub. Date: Mar. 31, 2011

(65) Prior Publication Data
US 2012/0175586 A1 Jul. 12, 2012

(51) Int. Cl.
*H01L 27/15* (2006.01)
*H01L 29/18* (2006.01)
*H01L 31/12* (2006.01)
*H01L 33/00* (2010.01)

(52) U.S. Cl.
USPC .............. 257/87; 257/79; 257/80; 257/84; 257/86; 257/E33.46

(58) Field of Classification Search
USPC ............... 257/79, 83–87, E27.119, E21.001, 257/E33.46, E33.001, E33.009, E33.01, E33.067
See application file for complete search history.

(56) References Cited

U.S. PATENT DOCUMENTS

| 5,523,592 | A * | 6/1996 | Nakagawa et al. | 257/96 |
| 8,030,664 | B2 * | 10/2011 | Moon et al. | 257/79 |
| 2006/0154392 | A1 * | 7/2006 | Tran et al. | 438/22 |
| 2006/0270086 | A1 * | 11/2006 | Rankin et al. | 438/46 |
| 2009/0014743 | A1 * | 1/2009 | Tran et al. | 257/98 |
| 2011/0284867 | A1 * | 11/2011 | Tran et al. | 257/76 |
| 2012/0175586 | A1 * | 7/2012 | Bratkovski et al. | 257/13 |

FOREIGN PATENT DOCUMENTS

JP 06-085317 3/1994

* cited by examiner

*Primary Examiner* — Chuong A Luu
*Assistant Examiner* — Cory Eskridge

(57) ABSTRACT

A silicon-germanium, quantum-well, light-emitting diode. The light-emitting diode includes a p-doped portion, a quantum-well portion, and an p-doped portion. The quantum-well portion is disposed between the p-doped portion and the n-doped portion. The quantum-well portion includes a carrier confinement region that is configured to facilitate luminescence with emission of light produced by direct recombination with a hole confined within the carrier confinement region. The p-doped portion includes a first alloy of silicon-germanium, and the n-doped portion includes a second alloy of silicon-germanium.

15 Claims, 9 Drawing Sheets

US 8,476,647 B2

SILICON-GERMANIUM, QUANTUM-WELL, LIGHT-EMITTING DIODE

This application is a 371 of PCT/US09/58373 Sep. 25, 2009.

TECHNICAL FIELD

Embodiments of the present invention relate generally to the field of light-emitting diodes (LEDs), and the utilization of a LED as an optical output driver for optical interconnection between integrated circuits (ICs).

BACKGROUND

The flow and processing of information creates ever increasing demands on the speed with which microelectronic circuitry processes such information. In particular, means of communicating between electronic devices over communication channels having high-bandwidth and high-frequency are of critical importance in meeting these demands.

Communication by means of optical channels has attracted the attention of the scientific and technological community to meet these demands. However, a basic incompatibility exists between the technology used for optical signal generation, which relies primarily on III-V semiconductor compounds, and the technology used for information processing, which relies on silicon-based, complementary-metal-oxide-semiconductor (CMOS) integrated circuits (ICs). Scientists engaged in the development of ultra-large-scale integration (ULSI) of microelectronic devices are keenly interested in finding a means for reconciling these disparate technologies. Thus, research scientists are actively pursuing new approaches for meeting these demands.

DESCRIPTION OF THE DRAWINGS

The accompanying drawings, which are incorporated in and form a part of this specification, illustrate embodiments of the technology and, together with the description, serve to explain the embodiments of the technology.

Figure 1:
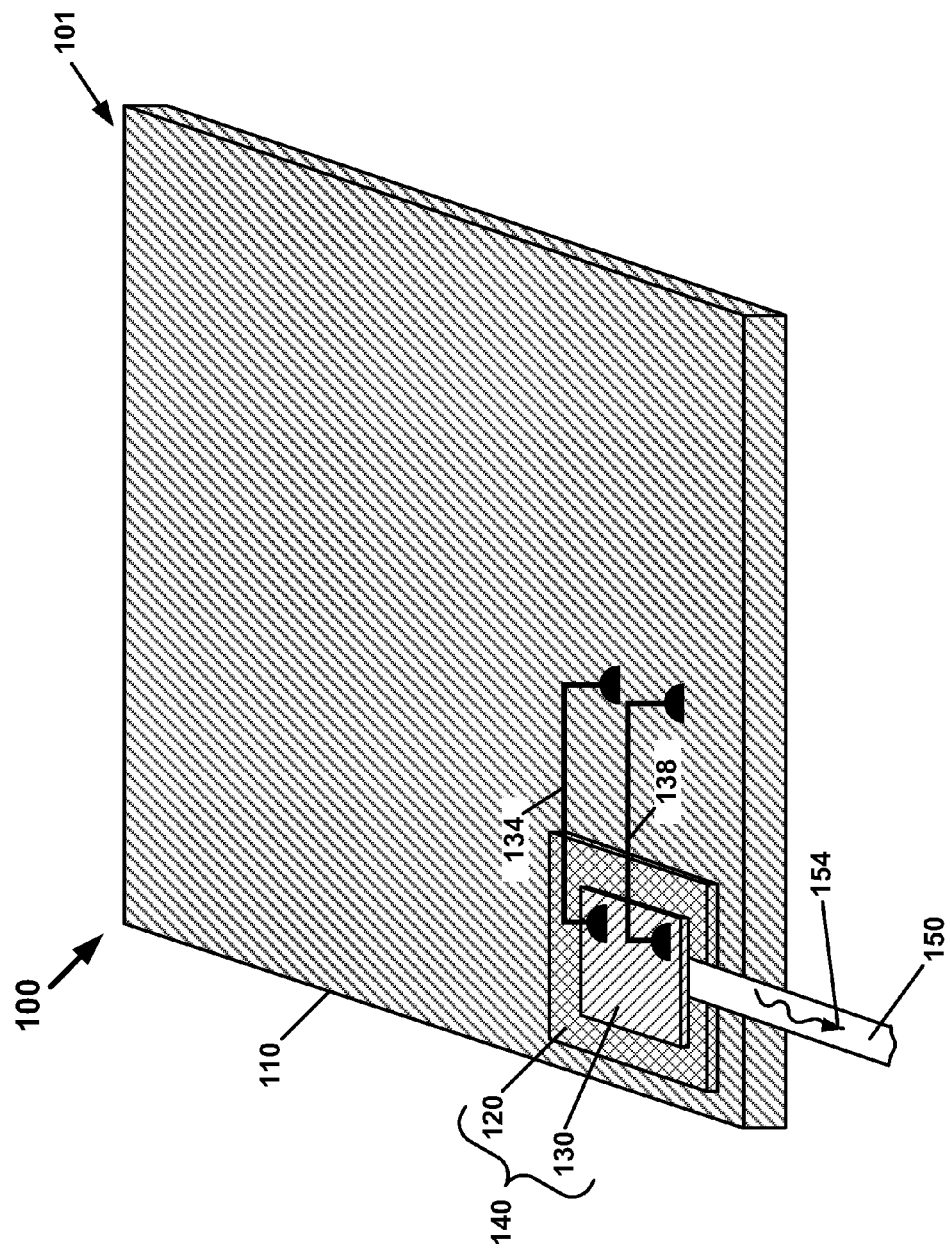
FIG. 1 is a perspective view of a combined silicon-germanium (SiGe), quantum-well (QW), light-emitting diode (LED), light modulator and integrated-circuit (IC) device, illustrating an example environment in which the SiGe, QW LED finds particular utility, as well as further illustrating the functional arrangement of the SiGe, QW LED, the light modulator and the IC in the example environment of the device, in an embodiment of the present invention.

The drawings referred to in this description should not be understood as being drawn to scale except if specifically noted.

DESCRIPTION OF EMBODIMENTS

Reference will now be made in detail to the alternative embodiments of the present invention. While the technology will be described in conjunction with the alternative embodiments, it will be understood that they are not intended to limit the technology to these embodiments. On the contrary, the technology is intended to cover alternatives, modifications and equivalents, which may be included within the spirit and scope of the technology as defined by the appended claims.

Furthermore, in the following description of embodiments of the present invention, numerous specific details are set forth in order to provide a thorough understanding of the present invention. However, it should be noted that embodiments of the present invention may be practiced without these specific details. In other instances, well known methods, procedures, and components have not been described in detail as not to unnecessarily obscure embodiments of the present invention. Throughout the drawings, like components are denoted by like reference numerals, and repetitive descriptions are omitted for clarity of explanation if not necessary.

Embodiments of the present invention include a silicon-germanium (SiGe), quantum-well (QW), light-emitting diode (LED). The LED includes a p-doped portion, a QW portion, and a p-doped portion. The QW portion is disposed between the p-doped portion and the n-doped portion. The QW portion includes a carrier confinement region that is configured to facilitate luminescence with emission of light produced by direct recombination of an electron with a hole confined within the carrier confinement region. The p-doped portion includes a first alloy of $Si_{1-x}Ge_x$, and the n-doped portion includes a second alloy of $Si_{1-x}Ge_x$.

Embodiments of the present invention are directed to a silicon-based and complementary-metal-oxide-semiconductor (CMOS) compatible LED structure. An accumulation of holes in a carrier confinement region of a QW is produced by hole injection from the anode of a forward biased SiGe, QW LED. Auger electrons that populate the center of the Brillouin zone at the Γ-point are produced by Auger transitions between electrons and accumulated holes in the carrier confinement region of the QW. Light may then be produced by direct recombination of the hot Auger electrons with the injected holes at the center of the Brillouin zone at the Γ-point. Direct recombination of the hot Auger electrons with holes results in much more efficient production of light, or luminescence, for embodiments of the present invention as a SiGe, QW LED, than light produced by indirect transitions in LEDs that might otherwise be made from indirect-bandgap semiconductors.

With reference now to FIG. 1, in accordance with an embodiment of the present invention, a perspective view 100 of a combined SiGe, QW, LED, light modulator and integrated-circuit (IC) device 101 is shown. FIG. 1 also illustrates the functional arrangement of a SiGe, QW LED 120, a light modulator 130 and an IC 110, also known by the term of art "chip," of the combined SiGe, QW LED, light modulator and IC device 101. FIG. 1 illustrates an example environment in which the SiGe, QW LED 120 finds particular utility. In particular, embodiments of the present invention for the SiGe, QW LED 120, which are subsequently described in greater detail, apply to and may be incorporated within the environment of the combined SiGe, QW LED, light modulator and IC device 101, as well as a combined SiGe, QW LED and light modulator device 140. The combined SiGe, QW LED, light modulator and IC device 101 includes IC 110 and the combined SiGe, QW LED and light modulator device 140. The combined SiGe, QW LED and light modulator device 140 includes the SiGe, QW LED 120 integrated with the light modulator 130. The SiGe, QW LED 120 includes a plurality of portions (not shown in FIG. 1, but shown in and later described in the discussion of FIGS. 4A and 4B) including a p-doped portion of an indirect-bandgap semiconductor, a QW portion of an indirect-bandgap semiconductor, and a n-doped portion of an indirect-bandgap semiconductor. The QW portion is disposed between the p-doped portion and the n-doped portion and includes a carrier confinement region configured to facilitate luminescence with the emission of light produced by direct recombination of an electron with a hole confined within the carrier confinement region. The p-doped portion may include a first alloy of $Si_{1-x}Ge_x$; and, the n-doped portion may include a second alloy of $Si_{1-x}Ge_x$.

With further reference to FIG. 1, in accordance with an embodiment of the present invention, the light modulator 130 is optically coupled with the SiGe, QW LED 120 for modulating light emitted from the SiGe, QW LED 120. Moreover, the light modulator 130 is configured to receive a signal from the IC 110 for modulating light emitted from the SiGe, QW LED 120. As shown in FIG. 1, light modulator 130 is coupled to the IC 110 through lines 134 and 138 that provide a signal to modulate light emitted from the SiGe, QW LED 120. Although in FIG. 1 the lines are shown as running over the top of the IC 110 and the light modulator 130 is shown as lying on top of the SiGe, QW LED 120, the arrangement shown is by way of example and not limitation thereto, as embodiments of the present invention encompass within their spirit and scope other arrangements, for example, where the light modulator 130 lies between SiGe, QW LED 120 and IC 110 with the lines 134 and 138 disposed between light modulator 130 in the IC 110. Also, an optical waveguide 150 for conducting a modulated light signal, represented by photon of light 154, which is emitted from the SiGe, QW LED 120, after modulation by the light modulator 130, is shown in FIG. 1.

With further reference to FIG. 1, in accordance with embodiments of the present invention, the combined SiGe, QW LED and light modulator device 140 provides an optical output driver for optical interconnection between ICs. Thus, the combined SiGe, QW LED and light modulator device 140 provides a device for overcoming the communication bandwidth bottleneck for rack-to-rack and chip-to-chip interconnection due to the ever increasing demands of processing information at high speeds and high densities. In one embodiment of the present invention, the combined SiGe, QW LED and light modulator device 140 may further include a luminescence enhancement structure, subsequently described in greater detail in the discussion of FIGS. 4A-4B and 5A-5D, including a thin-film metallic layer coupled with the QW portion and configured to facilitate direct recombination of an electron with a hole confined within the carrier confinement region through the action of surface plasmons present in the metallic layer. In another embodiment of the present invention, the combined SiGe, QW LED and light modulator device 140 may further include a light collector that is disposed between and the luminescence enhancement structure and the light modulator 130. In accordance with embodiments of the present invention, a light collector may be optically coupled with the SiGe, QW LED 120. Alternatively, a light collector may be optically coupled with at least one portion selected from the plurality of portions consisting of the p-doped portion, the QW portion and the n-doped portion of the SiGe, QW LED 120. In addition, the light collector may be optically coupled with the luminescence enhancement structure and the light modulator. The light modulator may further include a Mach-Zehnder interferometer. Because the IC may include a complementary-metal-oxide-semiconductor (CMOS) silicon integrated circuit based on monolithic silicon (Si) IC technology, embodiments of the present invention address compatibility issues that arise in attempting to use LEDs based on III-V compounds, for example, such as gallium arsenide (GaAs), which are used to fabricate conventional LEDs, by avoiding the use of III-V compound materials, which employ fabrication processes that, at the very least, are difficult to utilize in conjunction with monolithic Si IC fabrication technology. However, without embodiments of the present invention, the recombination coefficients for the production of light by indirect-bandgap semiconductors, for example, Si, germanium (Ge), and SiGe alloys, are typically orders of magnitude lower than for a direct-bandgap semiconductor, such as GaAs, as is next described.

Figure 2:
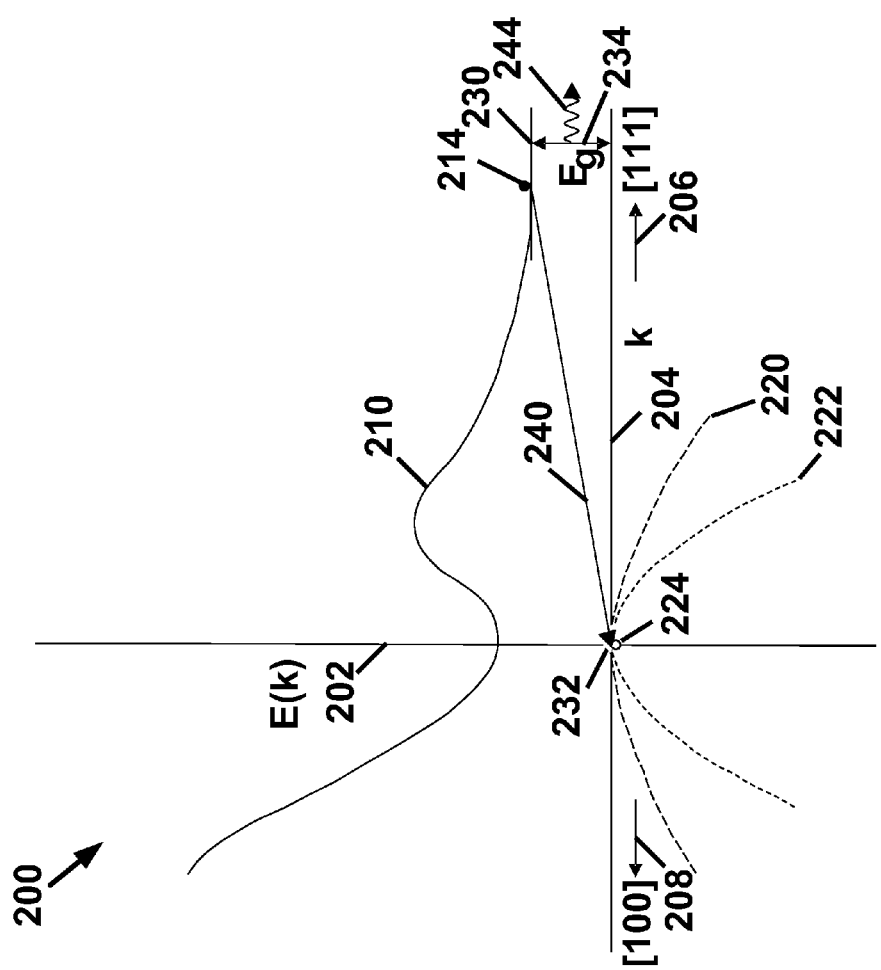
FIG. 2 is a band diagram showing a dispersion relationship in energy of electrons in a conduction band and holes in valence bands as a function of magnitude of a wave vector of the electron in the conduction band and the hole in the valence band along [111] and [100] directions in a Brillouin zone of an indirect-bandgap semiconductor, for example, germanium, or alternatively, an alloy of SiGe, and also showing recombination of an electron with a hole to produce a photon by an indirect transition, with relevance to embodiments of the present invention.

With reference now to FIG. 2, for the purpose of elucidating the utility of embodiments of the present invention, a band diagram 200 is shown. FIG. 2 shows a dispersion relationship in energy, E(k), of electrons in a conduction band 210 and of holes in valence bands 220 and 222 as a function of magnitude of a wave vector, k, of the electron in the conduction band 210 or the hole in the valence band, for example, one of valence bands 220 and 222, along [111] and [100] directions 206 and 208, respectively, in a Brillouin zone of an indirect-bandgap semiconductor. The band diagram 200 shown in FIG. 2 is representative of a band diagram of an indirect-bandgap semiconductor, such as, for example, Ge, or alternatively, an alloy of $Si_{1-x}Ge_x$. Although the following discussion is based on an indirect-bandgap semiconductor, such as Ge, or alternatively, an alloy of $Si_{1-x}Ge_x$, with a bottom 230 of the conduction band 210 at the L-point, embodiments of the present invention are not limited to such indirect-bandgap semiconductors alone, but rather indirect-bandgap semiconductors having conduction-band minima that lie more generally at other points in the Brillouin zone, for example, Si, or alternatively, a other alloys of $Si_{1-x}Ge_x$, having a bottom of a conduction band at an X-point, are also within the spirit and scope of embodiments of the present invention. Ordinate 202 of the band diagram 200 is energy, E(k), of an electron in the conduction band 210 or a hole in the valence bands 220 and 222, which is given in arbitrary units, but may be, for example, electron Volts (eV). Abscissa 204 of the band diagram 200 is magnitude of a wave vector, k, of an electron in the conduction band 210 or a hole in the valence band, for example, one of valence bands 220 and 222, along [111] and [100] directions 206 and 208, respectively, in the Brillouin zone, which is given in arbitrary units of reciprocal distance, but may be, for example, $10^8$ reciprocal centimeters ($10^8$ cm$^{-1}$).

With further reference to FIG. 2, for the purpose of elucidating the utility of embodiments of the present invention, the band diagram 200 shows recombination of an electron 214 at the bottom 230 of the conduction band 210 at the L-point of the Brillouin zone with a hole 224 at a top 232 of a valence band, for example, one of valence bands 220 and 222, at the Γ-point of the Brillouin zone to produce a photon of light 244 by an indirect transition 240. Two valence bands 220 and 222 are shown in FIG. 2: the heavy-hole, valence band 220, and the light-hole, valence band 222. For purposes of discussion, the hole 224 may be assumed to be at the top 232 of either of the heavy-hole, valence band 220, or the light-hole, valence band 222, without loss of generality, as the top 232 of the valence bands 220 and 222 may be assumed to occur at about the same energy for either of the two valence bands 220 and 222. In the indirect transition 240, the electron 214 recombines with the hole 224 to produce the photon of light 244 with an energy, hv, equal to energy, $E_g$, of the bandgap 234. The energy, $E_g$, of the bandgap 234 is equal to the difference in energy between the electron 214 at the bottom 230 of the conduction band 210 and the hole 224 at the top 232 of either of the valence bands 220 and 222. Thus, energy is conserved in the indirect transition 240. However, momentum is also conserved in the indirect transition 240. Because the momentum of the electron 214 at the L-point is not equal to the momentum of the hole 224 at the Γ-point and the momentum of the photon of light 244 is small, another particle mediates the indirect transition 240 so that momentum is conserved. An adventitious phonon having the momentum difference between the momentum of the electron 214 at the L-point and the momentum of the hole 224 at the Γ-point can serve as such a particle. Thus, in the indirect transition 240, all three events occur: the presence of the electron 214 at the bottom 230 of the conduction band 210 at the L-point of the Brillouin zone, the presence of the hole 224 at the top 232 of a valence band, for example, one of valence bands 220 and 222, at the Γ-point of the Brillouin zone, and the presence of an adventitious phonon having the momentum difference between the momentum of the electron 214 at the L-point and the momentum of the hole 224 at the Γ-point. The probability of all three events occurring simultaneously is the product of the probabilities of each occurring so that the radiative recombination rate in an indirect-bandgap semiconductor, such as Ge, is less than that of a direct bandgap semiconductor, such as GaAs, where an adventitious phonon does not participate in the transition. Some of the utility of embodiments of the present invention lies in mitigating the effects of the low probability attending indirect transitions in indirect-bandgap semiconductors, such as Ge, and the associated low radiative recombination rates of indirect-bandgap semiconductors, such as Ge, which is next described.

Figure 3:
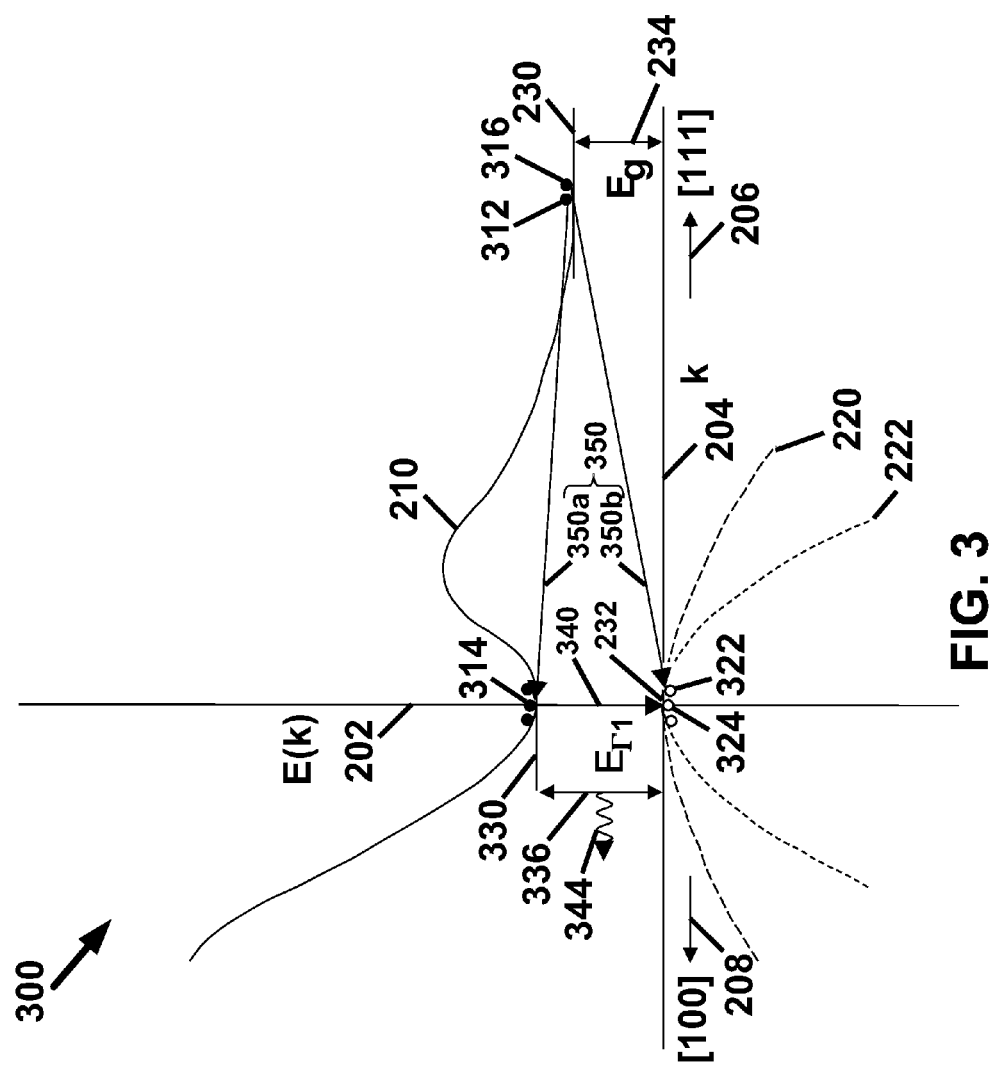
FIG. 3 is a band diagram showing a dispersion relationship in energy of electrons in a conduction band and holes in valence bands as a function of magnitude of a wave vector of the electron in the conduction band and the hole in the valence band along [111] and [100] directions in a Brillouin zone of an indirect-bandgap semiconductor, for example, germanium, or alternatively, an alloy of SiGe, and also showing recombination of a hot Auger electron with a hole to produce a photon by a direct transition from electrons promoted to populate states located in the conduction band at a band edge at a Γ-point at the center of the Brillouin zone from a bottom of the conduction band, in an embodiment of the present invention.

With reference now to FIG. 3, in accordance with an embodiment of the present invention, a band diagram 300 is shown. FIG. 3 shows the dispersion relationship in energy, E(k), of electrons in the conduction band 210 and holes in valence bands 220 and 222 as a function of magnitude of a wave vector, k, of the electron in the conduction band 210 or the hole in the valence band, for example, one of valence bands 220 and 222, along [111] and [100] directions 206 and 208, respectively, in a Brillouin zone of an indirect-bandgap semiconductor. The band diagram 300 shown in FIG. 3 is also representative of the band diagram of an indirect-bandgap semiconductor, such as Ge or alternatively, an alloy of $Si_{1-x}Ge_x$. Ordinate 202 of the band diagram 300 is energy, E(k), of an electron in the conduction band 210 or a hole in the valence bands 220 and 222, which is given in arbitrary units, but may be, for example, eV. Abscissa 204 of the band diagram 300 is magnitude of the wave vector, k, of an electron in the conduction band 210 or a hole in the valence band, for example, one of valence bands 220 and 222, along [111] and [100] directions 206 and 208, respectively, in the Brillouin zone, which is given in arbitrary units of reciprocal distance, but may be, for example, $10^8$ cm$^{-1}$.

With further reference to FIG. 3, in accordance with an embodiment of the present invention, the band diagram 300 shows recombination of a hot Auger electron 314 at a bottom 330 of the conduction band 210 at the Γ-point of the Brillouin zone with a hole 324 at the top 232 of the valence band, for example, one of valence bands 220 and 222, at the Γ-point of the Brillouin zone to produce a photon of light 344 by a direct recombination 340 from electrons, for example, electron 312, promoted, indicated by up-conversion portion 350a of the Auger transition 350, to the bottom 330 of a valley in the conduction band 210 to populate a state located at the center of the Brillouin zone at the Γ-point, from the bottom 230 of the conduction band 210 at the L-point. Two valence bands 220 and 222 are shown in FIG. 2: the heavy-hole, valence band 220, and the light-hole, valence band 222. In direct recombination 340, the hot Auger electron 314 recombines with the hole 324 to produce the photon of light 344 with an energy, hv, equal to the energy, $E_{Γ1}$, of the bandgap 336 at the Γ-point. The energy, $E_{Γ1}$, of the bandgap 336 at the Γ-point is equal to the difference in energy between the hot Auger electron 314 at the bottom 330 of the valley in the conduction band 210 at the Γ-point and the hole 324 at the top 232 of either of the valence bands 220 and 222. Energy is also conserved in direct recombination 340. Similarly, momentum is also conserved in direct recombination 340, because the hole 324 and the hot Auger electron 314 have the same momentum being located at the same point in k-space. Because both energy and momentum are conserved in direct recombination 340 between the hot Auger electron 314 and the hole 324, another particle does not mediate conservation of energy and momentum in direct recombination 340. Thus, in direct recombination 340, two events occur: the presence of the hot Auger electron 314 at the bottom 330 of the conduction band 210 at the Γ-point of the Brillouin zone, and the presence of the hole 324 at the top 232 of a valence band, for example, one of valence bands 220 and 222, at the Γ-point of the Brillouin zone. The probability of the two events occurring simultaneously is the product of the probabilities of each occurring so that the radiative recombination rate in an indirect-bandgap semiconductor, such as Ge, or alternatively, an alloy of $Si_{1-x}Ge_x$, for direct recombination 340 at the Γ-point with energy, $E_{Γ1}$, of the bandgap 336 may be higher than the probability of the three events occurring simultaneously for the indirect transition 240 described above in the discussion of FIG. 2, if the states around the bottom 330 of the valley in the conduction band 210 at the Γ-point are sufficiently filled by electrons. In order for the radiative recombination rate in the indirect-bandgap semiconductor for direct recombination 340 at the Γ-point to approach that for a direct transition in a direct bandgap semiconductor, such as GaAs, the occupation of states by electrons, as indicated by the plurality of electrons (shown as "black dots"), at the bottom 330 of the valley in the conduction band 210 at the Γ-point is increased by embodiments of the present invention. The energy diagram for the Auger up-conversion process suggests that the production of light, by radiative recombination, proceeds when the condition $E_{Γ1}-E_g<E_g$ is satisfied.

With further reference to FIG. 3, embodiments of the present invention increase the occupation of states by electrons at the bottom 330 of the valley in the conduction band 210 at the Γ-point by generating a hot electrons by Auger recombination in the structure of the SiGe, QW LED, for example, SiGe, QW LED 120 which is subsequently described in FIGS. 4A and 4B. The hot electrons can be generated by forward biasing the SiGe, QW LED 120. Hot electrons can then fill higher energy states in the conduction band 210 and, in particular, the higher energy states located at the bottom 330 of the valley in the conduction band 210 at the Γ-point. In accordance with embodiments of the present invention, the Auger transition, which is a radiationless transition between an electron 316 at the conduction band minimum and a hole 322 at the valence band maximum produces these hot electrons, for example, a hot Auger electron 314, with the energy and momenta to occupy energy states at the bottom 330 of the valley in the conduction band 210 at the Γ-point. For example, the up-conversion portion 350a of the Auger transition 350, of electron 312 from the bottom 230 of the conduction band 210 at the L-point to the higher energy states located at the bottom 330 of the valley in the conduction band 210 at the Γ-point, as a hot Auger electron 314, occurs by Auger transition 350. A recombination portion 350b of the Auger transition 350 accompanies the up-conversion portion 350a and provides the increased kinetic energy for the hot Auger electron 314 at the bottom 230 of the conduction band 210. The up-conversion portion 350a of the Auger transition 350 proceeds when the difference between the energy level at the bottom 330 of the conduction band 210 at the Γ-point and the bottom 230 of the conduction band 210 at the L-point, given by, $E_{Γ1}-E_g$, is less than the difference between the energy level at the bottom 230 of the conduction band 210 at the L-point and the energy level at the top 232 of the valence band, for example, heavy-hole, valence band 220, given by the energy, $E_g$, of the bandgap 234. Thus, the relative position of the band edges satisfy the condition $E_{Γ1}-E_g<E_g$, so that the production of light would be possible. In accordance with embodiments of the present invention, this condition, $E_{Γ1}-E_g<E_g$, is met for $Si_{1-x}Ge_x$ alloys with compositions around x=0.5. Direct recombination 340 of hot Auger electrons, for example, similar to hot Auger electron 314, in states around the bottom 330 of the valley in the conduction band 210 at the Γ-point with holes, for example, hole 324, at the top of the valence bands 220 and 222 is by a fast process so that the radiative recombination rate for luminescence by these hot Auger electrons is much greater than the radiative recombination rate for luminescence by the slow process of the indirect transition 240 described above in the discussion of FIG. 2. In accordance with embodiments of the present invention, details of the structure of the SiGe, QW LED 120, which are utilized to generate the hot Auger electrons of which hot Auger electron 314 is an example, are next described.

Figure 4A:
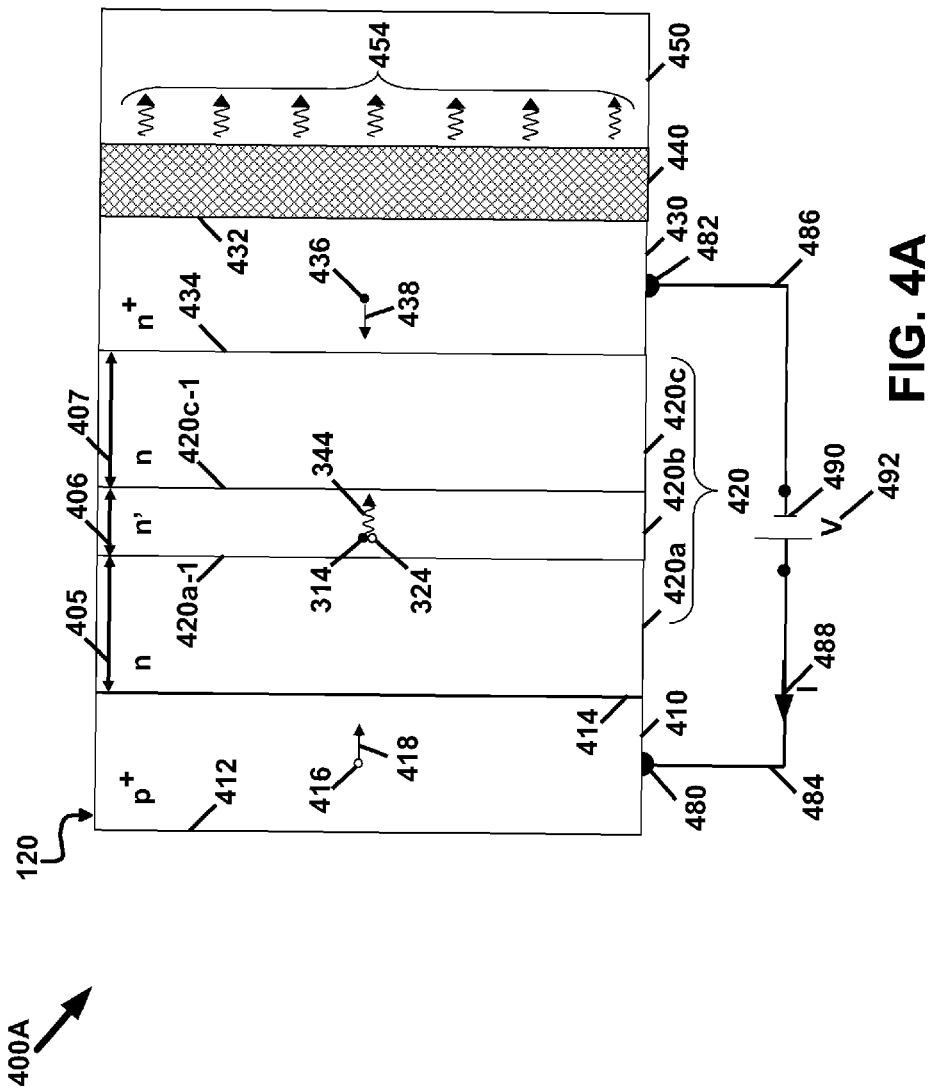
FIG. 4A is a cross-sectional elevation view of an SiGe, QW LED illustrating the functional arrangement of a p-doped portion, a QW portion and a n-doped portion in the structure of the SiGe, QW LED, and further illustrating the QW portion which includes a carrier confinement region configured to facilitate luminescence with the emission of light produced by direct recombination of an electron with a hole when the SiGe, QW LED is forward biased, in an embodiment of the present invention.

With reference now to FIG. 4A, in accordance with an embodiment of the present invention, a cross-sectional elevation view 400A of the SiGe, QW LED 120 is shown. FIG. 4A illustrates the functional arrangement of a p-doped portion 410, a QW portion 420, a n-doped portion 430 of the SiGe, QW LED 120. FIG. 4A also illustrates details of the QW portion 420 which includes a carrier confinement region configured to facilitate luminescence with the emission of light 344 produced by direct recombination of electron 314 with hole 324 when the SiGe, QW LED 120 is forward biased. The SiGe, QW LED 120 includes a plurality of portions including the p-doped portion 410 of an indirect-bandgap semiconductor, the QW portion 420 of an indirect-bandgap semiconductor, and the n-doped portion 430 of an indirect-bandgap semiconductor. The indirect-bandgap semiconductor includes SiGe. The QW portion 420 is disposed between the p-doped portion 410 and the n-doped portion 430 and forms a junction 414 with the p-doped portion 410, and a junction 434 with the n-doped portion 430. In embodiments of the present invention, the QW portion 420 includes a carrier confinement region configured to facilitate luminescence with emission of light 344 produced by direct recombination 340 of electron 314 with hole 324 confined within the carrier confinement region. In embodiments of the present invention, the p-doped portion 410 includes a first alloy of $Si_{1-x}Ge_x$; and, the n-doped portion 430 includes a second alloy of $Si_{1-x}Ge_x$. In one embodiment of the present invention, the composition of the first and second alloys is the same, by way of example without limitation thereto, as compositions of the first and second alloys differing from one another are also within the spirit and scope of embodiments of the present invention; if the composition of the first and second alloys is the same, x may be equal to about 0.4, so that the alloy composition of the first and second alloys is given by the formula $Si_{0.6}Ge_{0.4}$, by way of example without limitation thereto. As shown in FIG. 4A, in another embodiment of the present invention, the p-doped portion 410 is degenerately doped $p^+$-type material with a hole carrier density, p, equal to between about $5\times10^{17}$ cm$^{-3}$ to $5\times10^{18}$ cm$^{-3}$, and the n-doped portion 430 is degenerately doped $n^+$-type material with an electron carrier density, n, equal to about $1\times10^{17}$ cm$^{-3}$, by way of example without limitation thereto.

With further reference to FIG. 4A, in accordance with an embodiment of the present invention, the QW portion 420 of the SiGe, QW LED 120 includes a first QW portion 420a, a second QW portion 420b, and a third QW portion 420c. In an embodiment of the present invention, the second QW portion 420b is disposed between the first QW portion 420a and the third QW portion 420c. The second QW portion 420b forms a junction 420a-1 with the first QW portion 420a, and a junction 420c-1 with the third QW portion 420c. In one embodiment of the present invention, the second QW portion 420b includes the carrier confinement region. In another embodiment of the present invention, the first QW portion 420a includes a third alloy of $Si_{1-x}Ge_x$, the second QW portion 420b includes a fourth alloy of $Si_{1-x}Ge_x$, and the third QW portion 420c includes a fifth alloy of $Si_{1-x}Ge_x$. In one embodiment of the present invention, the composition of the third and fifth alloys is the same, by way of example without limitation thereto, as compositions of the third and fifth alloys differing from one another are also within the spirit and scope of embodiments of the present invention; if the composition of the third and fifth alloys is the same, x may be equal to about 0.4, so that the alloy composition of the third and fifth alloys is given by the formula $Si_{0.6}Ge_{0.4}$, by way of example without limitation thereto. As shown in FIG. 4A, in another embodiment of the present invention, the first QW portion 420a is n-doped material, and the third QW portion 420c is n-doped material. In one embodiment of the present invention, the composition of the fourth alloy is given by x equal to about 0.5, so that the alloy composition of the fourth alloy is given by the formula $Si_{0.5}Ge_{0.5}$. In an embodiment of the present invention, the composition of the fourth $Si_{1-x}Ge_x$ alloy may be adjusted to provide the energy, $E_{\Gamma 1}$, of the bandgap 336 at the Γ-point of the fourth $Si_{1-x}Ge_x$ alloy for production of light 344 with a wavelength between about 850 nanometers (nm) and about 1550 nm. In another embodiment of the present invention, the composition of the fourth $Si_{1-x}Ge_x$ alloy may be adjusted to produce light 344 with a wavelength of about 850 nm.

With further reference to FIG. 4A, in accordance with an embodiment of the present invention, as shown in FIG. 4A, the second QW portion 420b is lightly doped n'-type material with an electron carrier density, n, equal to about $1 \times 10^{16}$ cm$^{-3}$, in the unbiased state. The composition difference between the second QW portion 420b and the first and third QW portions 420a and 420c produces a potential well for holes only, and the electron confinement is provided by the condition of local electroneutrality. Thus, electrons are not confined in a "well" in the second QW portion 420b as are the holes, but rather are confined by the condition of local electroneutrality, so that the QW portion 420 is referred to by the term of art, "type-II heterostructure." In an embodiment of the present invention, the overall structure of the SiGe, QW LED 120 including the type-II heterostructure of the QW portion 420 is given by the formula p$^+$-$Si_{0.6}Ge_{0.4}$/n-$Si_{0.6}Ge_{0.4}$/n'-$Si_{1-x}Ge_x$/n-$Si_{0.6}Ge_{0.4}$/n$^+$-$Si_{0.6}Ge_{0.4}$. In an embodiment of the present invention, the composition of the second QW portion 420b is given by $Si_{1-x}Ge_x$, where x is about equal to 0.5. In an embodiment of the present invention, the second QW portion 420b has a width 406 of between about 30 nm to about 50 nm; the width 405 of the first QW portion 420a is about 100 nm; and, the width 407 of the third QW portion 420c is about 100 nm, by way of example without limitation thereto. In another embodiment of the present invention, the widths 405 and 407 of the respective first and third QW portions 420a and 420c are comparable to, or slightly smaller than, the depletion length, $l_D$, equal to between about $8 \times 10^{-6}$ cm and about 0.1 micrometers (μm).

With further reference to FIG. 4A, in accordance with an embodiment of the present invention, the SiGe, QW LED 120 may further include a luminescence enhancement structure 440, which may be disposed on one side 432 of the electronically active portion, which includes p-doped portion 410, QW portion 420 and n-doped portion 430, of the SiGe, QW LED 120. In one embodiment of the present invention, the luminescence enhancement structure 440 includes a thin-film metallic layer coupled with the QW portion 420; the luminescence enhancement structure 440 is configured to facilitate direct recombination 340 of electron 314 with hole 324, as previously described in the discussion of FIG. 3, confined within the carrier confinement region through the action of surface plasmons (not shown) present in the metallic layer. In one embodiment of the present invention, the thin-film metallic layer may include silver. In other embodiments of the present invention, the thin-film metallic layer may include gold. In another embodiment of the present invention, the thin-film metallic layer includes a metal selected from the group consisting of silver, gold, aluminum and copper. In other embodiments of the present invention, the luminescence enhancement structure 440 may include any of a variety of structures, which are subsequently described in the discussion of FIG. 5A-5D. In particular, in one embodiment of the present invention, the luminescence enhancement structure 440 includes at least one thin-film metallic layer including a portion of a cavity structure (not shown). For example, a second luminescence enhancement structure, similar to the luminescence enhancement structure 440, may be disposed on the opposite side 412 of the electronically active portion, which includes p-doped portion 410, QW portion 420 and n-doped portion 430, of the SiGe, QW LED 120. In accordance with embodiments of the present invention, the luminescence enhancement structure 440, which includes at least one thin-film metallic layer including a portion of a cavity structure, may further include any of the variety of structures, which are subsequently described in the discussion of FIG. 5A-5D, by way of example without limitation thereto.

With further reference to FIG. 4A, in accordance with an embodiment of the present invention, the SiGe, QW LED 120 may further include a light collector 450. In an embodiment of the present invention, the light collector 450 optically is coupled with the luminescence enhancement structure 440 and configured for collecting emitted light 454. Alternatively, in other embodiments of the present invention, a luminescence enhancement structure, similar to the luminescence enhancement structure 440, may be disposed on the opposite side 412 of the electronically active portion, which includes p-doped portion 410, QW portion 420 and n-doped portion 430, of the SiGe, QW LED 120, without the luminescence enhancement structure 440 interposed between the light collector 450 and the side 432 of the electronically active portion and with the light collector 450 disposed on and in contact with the side 432 of the electronically active portion; in this case, the luminescence enhancement structure may also serve as a mirror that reflects light emitted by the SiGe, QW LED 120 to the light collector 450 disposed on and in contact with the side 432 of the electronically active portion. Also, in accordance with embodiments of the present invention, although the SiGe, QW LED 120 is shown in FIG. 4A as an arrangement of portions layered horizontally from left to right, this is by way of example without limitation thereto, as an arrangement of portions layered vertically from bottom to top on top of a monolithic substrate, as might be used for a SiGe, QW LED integrated with a monolithic IC, for example, IC 110, is also within the spirit and scope of embodiments of the present invention. For example without limitation thereto, in one embodiment of the present invention, the p-doped portion 410 may be disposed on the monolithic substrate with the remaining layers layered above the p-doped portion 410 in the order shown in FIG. 4A from left to right with the light collector 450 disposed on top of the layered structure. By way of another example without limitation thereto, in another embodiment of the present invention, a luminescence enhancement structure may be disposed on the monolithic substrate with the remaining layers, excepting the luminescence enhancement structure 440, layered starting with the p-doped portion 410 disposed on the luminescence enhancement structure in the order shown in FIG. 4A from left to right with the light collector 450 disposed on top of the layered structure. Alternatively, by way of another example without limitation thereto, in another embodiment of the present invention, a light collector may be disposed on the monolithic substrate with the remaining layers, excepting the light collector 450, layered starting with the p-doped portion 410 disposed on the light collector in the order shown in FIG. 4A from left to right with the luminescence enhancement structure 440 disposed on top of the layered structure. Alternatively, by way of another example without limitation thereto, in another embodiment of the present invention, a light collector may be disposed on the monolithic substrate with a luminescence enhancement structure disposed on the light collector and the remaining layers, excepting the luminescence enhancement structure 440 and light collector 450, layered starting with the p-doped portion 410 disposed on the luminescence enhancement structure in the order shown in FIG. 4A from left to right with the n-doped portion 430 disposed on top of the layered structure. Other arrangements involving various other permutations of portions of the SiGe, QW LED 120 are also within the spirit and scope of embodiments of the present invention. For example, by way of another example without limitation thereto, in other embodiments of the present invention, the structure of the SiGe, QW LED 120 may be arranged starting first with the n-doped portion 430 disposed on the monolithic substrate, or alternatively, on the light collector, or alternatively, on luminescence enhancement structure, in the embodiments of the present invention described immediately above, but in the order shown in FIG. 4A from right to left.

With further reference to FIG. 4A, in accordance with an embodiment of the present invention, a forward bias voltage 492, V, is applied to the SiGe, QW LED 120 by an external voltage source 490, represented by the battery in FIG. 4A, with voltage 492, V. The voltage source 490 causes a current 488, I, to flow in a circuit through the SiGe, QW LED 120 provided by the leads 484 and 486, which make contact to the p-doped portion 410 and the n-doped portion 430 at contacts 480 and 482, respectively. In one embodiment of the present invention, the total current 488, I, is about equal to 10 milli-Amperes (mA); the voltage 492, V, is about equal to 1 volt (V) so that the total power, $W_{tot}$, is about equal to 10 milliwatts (mW). In another embodiment of the present invention, the current carrying area, S, of the SiGe, QW LED 120 is about equal to 3 μm×3 μm, or approximately equal to $1 \times 10^{-7}$ cm$^2$, so that, for the voltage 492, V, and current 488, I, given above, the current density, J, is about equal to $1 \times 10^5$ A/cm$^2$. The majority carriers in the p-doped portion 410 are holes, of which hole 416 is an example, which flow towards the negative terminal of the voltage source 490 with a hole current 418 in the p-doped portion 410, when the voltage 492, V, is applied to the SiGe, QW LED 120. Similarly, the majority carriers in the n-doped portion 430 are electrons, of which electron 436 is an example, which flow towards the positive terminal of the voltage source 490 with an electron current 438 in the n-doped portion 430, when the voltage 492, V, is applied to the SiGe, QW LED 120. When a sufficiently high voltage 492, V, is applied to the SiGe, QW LED 120, the electric field of a barrier potential at the junction 414 may be lowered such that the p-doped portion 410 may provide a source for the injection of holes, of which hole 416 is an example, into the QW portion 420 of the SiGe, QW LED 120, which is next described in greater detail.

Figure 4B:
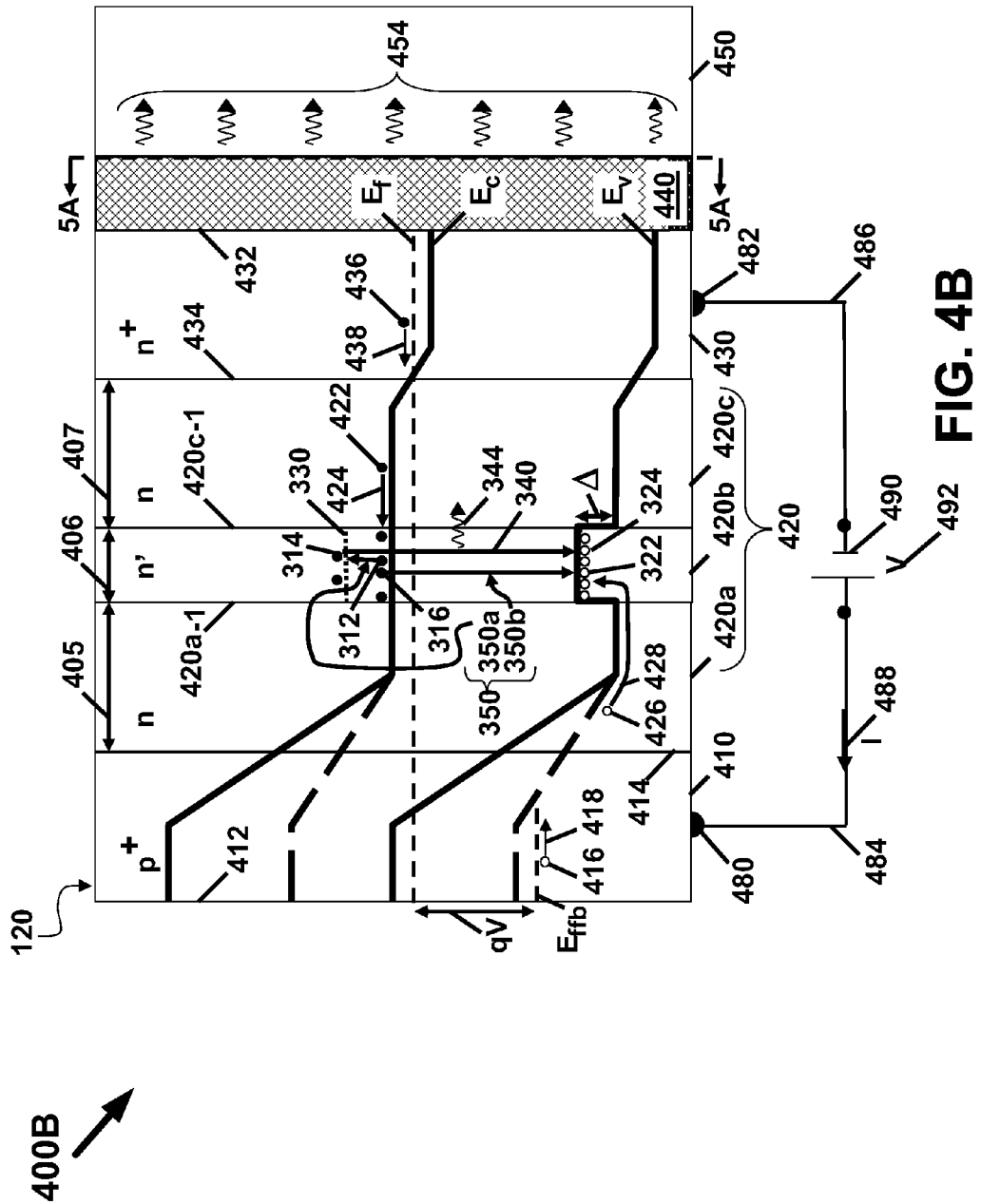
FIG. 4B is a cross-sectional elevation view of the SiGe, QW LED of FIG. 4A illustrating a band diagram showing accumulation of an injected hole in the carrier confinement region and the production of a hot Auger electron at a bottom of the conduction band at the Γ-point of the Brillouin zone by an Auger transition with subsequent direct recombination by the process of FIG. 3 and a luminescence enhancement structure configured to facilitate direct recombination of an electron with a hole confined within the carrier confinement region through the action of surface plasmons, in an embodiment of the present invention.

With reference now to FIG. 4B, in accordance with an embodiment of the present invention, a cross-sectional elevation view 400B of the SiGe, QW LED 120 of FIG. 4A is shown. FIG. 4B illustrates a band diagram showing accumulation 428 of an injected hole 426 in the carrier confinement region of the QW portion 420 of the SiGe, QW LED 120, and the production of a hot Auger electron 314 at the bottom 330 of the conduction band 210 at the Γ-point of the Brillouin zone by the Auger transition 350, as previously described in the discussion of FIG. 3. FIG. 4B also illustrates subsequent direct recombination 340 by the process of FIG. 3 and the luminescence enhancement structure 440 configured to facilitate direct recombination 340 of electron 314 with hole 324 confined within the carrier confinement region of the QW portion 420 through the action of surface plasmons. In the discussion of FIG. 4B, like components denoted by like reference numerals of the previously described FIGS. 1-4A are as previously described and repetitive descriptions are omitted from the following description of FIG. 4B so as to clearly explain the band diagram and the relationship of processes shown in the band diagram to the structure of the SiGe, QW LED 120. By way of example without limitation thereto, the band diagram of the SiGe, QW LED 120 shows: the conduction-band minimum at energy, $E_c$, the valence-band maximum at energy, $E_v$, and the Fermi energy, $E_f$.

With further reference to FIG. 4B, in accordance with an embodiment of the present invention, in the unbiased state of the SiGe, QW LED 120, which is the state of the SiGe, QW LED 120 without a bias voltage 492, V, applied by voltage source 490, the conduction-band minimum at energy, $E_c$, and the valence-band maximum at energy, $E_v$, are disposed within the SiGe, QW LED 120 at the energy levels indicated by the heavy solid lines. In particular, there is a fairly high barrier potential in the vicinity of the junction 414 between the p-doped portion 410 and the QW portion 420, which is indicated at the left of FIG. 4B by the inclined solid-line portions of the conduction-band minimum and the valence-band maximum. In the biased state of the SiGe, QW LED 120, which is the state of the SiGe, QW LED 120 with a bias voltage 492, V, applied by voltage source 490, the conduction-band minimum and the valence-band maximum are disposed within the SiGe, QW LED 120 at the energy levels indicated by the heavy solid lines from right to left up to the left portion of the QW portion 420, from whence the energy levels are represented by the heavy dashed lines extending to the left of FIG. 4B ending at the side 412 of the SiGe, QW LED 120 in the p-doped portion 410. Details of the band structure within the SiGe, QW LED 120 such as band bending and other changes in configuration of the conduction-band minimum and the valence-band maximum, as well as the Fermi level, $E_f$, are not shown so as not to unduly complicate FIG. 4B. In particular, to focus attention on details relevant to the discussion, the conduction-band minimum and the valence-band maximum in the p-doped portion 410 is shown as dropping by the full amount, qV, produced by the applied bias voltage 492, V, so that the barrier potential in the vicinity of the junction 414 between the p-doped portion 410 and the QW portion 420 is lowered as indicated at the left of FIG. 4B by the inclined dashed-line portions of the conduction-band minimum and the valence-band maximum.

With further reference to FIG. 4B, in accordance with an embodiment of the present invention, in the unbiased state of the SiGe, QW LED 120, the Fermi level, $E_f$, is disposed within the SiGe, QW LED 120 at the energy level indicated by the dashed horizontal line extending from one side 432 to the other side 412 of the SiGe, QW LED 120. In one embodiment of the present invention, by way of example without limitation thereto, the Fermi level, $E_f$, lies above the conduction-band minimum at energy, $E_c$, in the n-doped portion 430 of the SiGe, QW LED 120, which is consistent with the embodiment of the present invention in which the n-doped portion 430 is degenerately doped n+-type material. In another embodiment of the present invention, by way of example without limitation thereto, the Fermi level, $E_f$, lies below the valence-band maximum at energy, $E_v$, in the p-doped portion 410 of the SiGe, QW LED 120, which is consistent with the embodiment of the present invention in which the p-doped portion 410 is degenerately doped p+-type material. In another embodiment of the present invention, in the biased state of the SiGe, QW LED 120, the Fermi level, $E_f$, is lowered in the p-doped portion 410 relative to the n-doped portion 430 by the full amount, qV, produced by the applied bias voltage 492, V, to the forward-biased Fermi level, $E_{fb}$, indicated by the dashed horizontal line extending from the middle of p-doped portion 410 to side 412 of the SiGe, QW LED 120; in the QW portion 420 and the n-doped portion 430, in the biased state of the SiGe, QW LED 120, the Fermi level, $E_f$, is shown as being unaffected by the applied bias voltage 492, V, and in the remaining portion of the p-doped portion 410 in the vicinity of the junction 414, the Fermi level is not shown at all so as not to unduly complicate the discussion.

With further reference to FIG. 4B, in accordance with an embodiment of the present invention, the QW portion 420 includes a carrier confinement region that is formed by the second QW portion 420b disposed between the first QW portion 420a and the third QW portion 420c. As previously described in the discussion of FIG. 4A, in accordance with embodiments of the present invention, the carrier confinement region is produced by the composition difference between the second QW portion 420b and the first and third QW portions 420a and 420c which produces a potential well for holes only; the carrier confinement region is shown in the band diagram of FIG. 4B as an elevation of the valence-band maximum by a well depth, $\Delta$, which moves the top of the valence-band maximum towards the conduction-band minimum in the second QW portion 420b between the sides of the QW provided by the junctions 420a-1 and 420c-1 between the second QW portion 420b and the first and third QW portions 420a and 420c, respectively. Since hole energy increases with greater depth below the valence-band maximum, the elevation of the valence-band maximum provides a localized well of lower hole energy in which holes may be confined, which provides the underlying reason for the use of the term of art, "quantum well." As previously described in the discussion of FIG. 4A, the type-II heterostructure of the QW portion 420, which is given by the formula n-$Si_{0.6}Ge_{0.4}$/ n'-$Si_{1-x}Ge_x$/n-$Si_{0.6}Ge_{0.4}$, confines holes within the carrier confinement region, but a QW in the conduction-band minimum is absent, which is indicated by the flat conduction-band minimum of the second QW portion 420 across the junctions 420a-1 and 420c-1 between the second QW portion 420b and the first and third QW portions 420a and 420c, as electron confinement is provided by the condition of local electroneutrality. For one embodiment of the present invention, the composition of the second QW portion 420b is given by $Si_{1-x}Ge_x$, where x is about equal to 0.6, which provides a well depth, $\Delta$, for holes such that the well depth, $\Delta$, is approximately equal to between 100 meV and 150 meV. In an embodiment of the present invention, for a width 406 of the second QW portion 420b, which includes the carrier confinement region, that is equal to between about 30 nm to about 50 nm, the confinement energy, $\Delta E$, for holes in the confinement region of the QW portion 420 is equal to between about 2 meV and about 3 meV, which is much less than the well depth, $\Delta$, which is approximately equal to between 100 meV and 150 meV.

With further reference to FIG. 4B, in accordance with embodiments of the present invention, the detailed operation of the SiGe, QW LED 120 is next described. In embodiments of the present invention, the bias voltage 492, V, applied between the p-doped portion 410 and the n-doped portion 430 causes the injection of holes, of which hole 416 is an example, with a hole current 418 from the p-doped portion 410 into the QW portion 420 across junction 414 and the injection of electrons, of which electron 436 is an example, with an electron current 438 from the n-doped portion 430 into the QW portion 420 across junction 434. The holes injected from the p-doped portion 410 into the QW portion 420, of which hole 426 is an example, are driven over a barrier potential which is produced by the application of the voltage 492, V, and fall over the side of the QW through accumulation 428 in the carrier confinement region of the QW. Correspondingly, the electrons injected from the n-doped portion 430 into the QW portion 420, of which hole 422 is an example, are driven by the application of the voltage 492, V, towards the carrier confinement region of the QW by accumulation 424, which occurs in response to the condition imposed by electroneutrality in the carrier confinement region. Thus, in accordance with embodiments of the present invention, the p-doped portion 410, the QW portion 420, and the n-doped portion 430 of the SiGe, QW LED 120 are configured to produce an accumulation of an injected hole 426 in the carrier confinement region when biased in a forward bias condition. In accordance with an embodiment of the present invention, the maximal hole density, $p_{QW}$, in the carrier confinement region of the QW portion 420 is equal to about $1 \times 10^{20}$ cm$^{-3}$.

With further reference to FIG. 4B, in accordance with embodiments of the present invention, holes which are confined in the carrier confinement region, of which hole 322 is an example, then recombine with electrons, of which electron 316 is an example, in the Auger transition 350, which includes up-conversion portion 350a and recombination portion 350b, to produce a hot Auger electron 314 at the $\Gamma$-point of the conduction band by up-conversion portion 350a of electrons, of which electron 312 is an example, accumulated in the carrier confinement region. The recombination portion 350b of the Auger transition 350 accompanies the up-conversion portion 350a and provides the increased kinetic energy for the hot Auger electron 314 at the bottom 230 of the conduction band 210. For purposes of simplifying the discussion, the Auger transition 350 is shown, herein, as including a separate up-conversion portion 350a and a separate recombination portion 350b, when in fact the two portions are inseparably interconnected with one another quantum mechanically. Thus, in accordance with embodiments of the present invention, the p-doped portion 410, the QW portion 420, and the n-doped portion 430 of the SiGe, QW LED 120 are configured to facilitate Auger recombination in the Auger transition 350 in the carrier confinement region of the QW portion 420 and production of carriers at the $\Gamma$-point for direct recombination 340 of electron 314 with hole 324 confined within the carrier confinement region to produce light 344. In accordance with an embodiment of the present invention, the Auger recombination time, $\tau_A$, is about equal to $4 \times 10^{-10}$ seconds (s).

With further reference to FIG. 4B, in accordance with embodiments of the present invention, the composition of the SiGe alloy may be adjusted to provide a bandgap, for example, bandgap 336 at the $\Gamma$-point with energy, $E_{\Gamma 1}$, of the SiGe alloy for production of light 344 with a wavelength between about 850 nm and about 1550 nm. In particular, the composition of the SiGe alloy may be adjusted to produce light 344 with a wavelength of about 850 nm. The SiGe, QW LED 120 may further include the light collector 450 for collecting photons from and optically coupled with the luminescence enhancement structure 440 of the SiGe, QW LED 120. In accordance with an embodiment of the present invention, the light collector 450 may include a portion of a light modulator, for example, similar to light modulator 130. Alternatively, the light collector 450 may be optically coupled with the light modulator, for example, similar to light modulator 130, through a grating, which may be provided by luminescence enhancement structure 440. A cutting plane 5A-5A through the luminescence enhancement structure 440 is also shown in FIG. 4B; the luminescence enhancement structure 440 may include any of a variety of structures, which are next described in the discussion of FIGS. 5A-5D with the aid of plan views provided by the cutting plane 5A-5A.

Figure 5A:
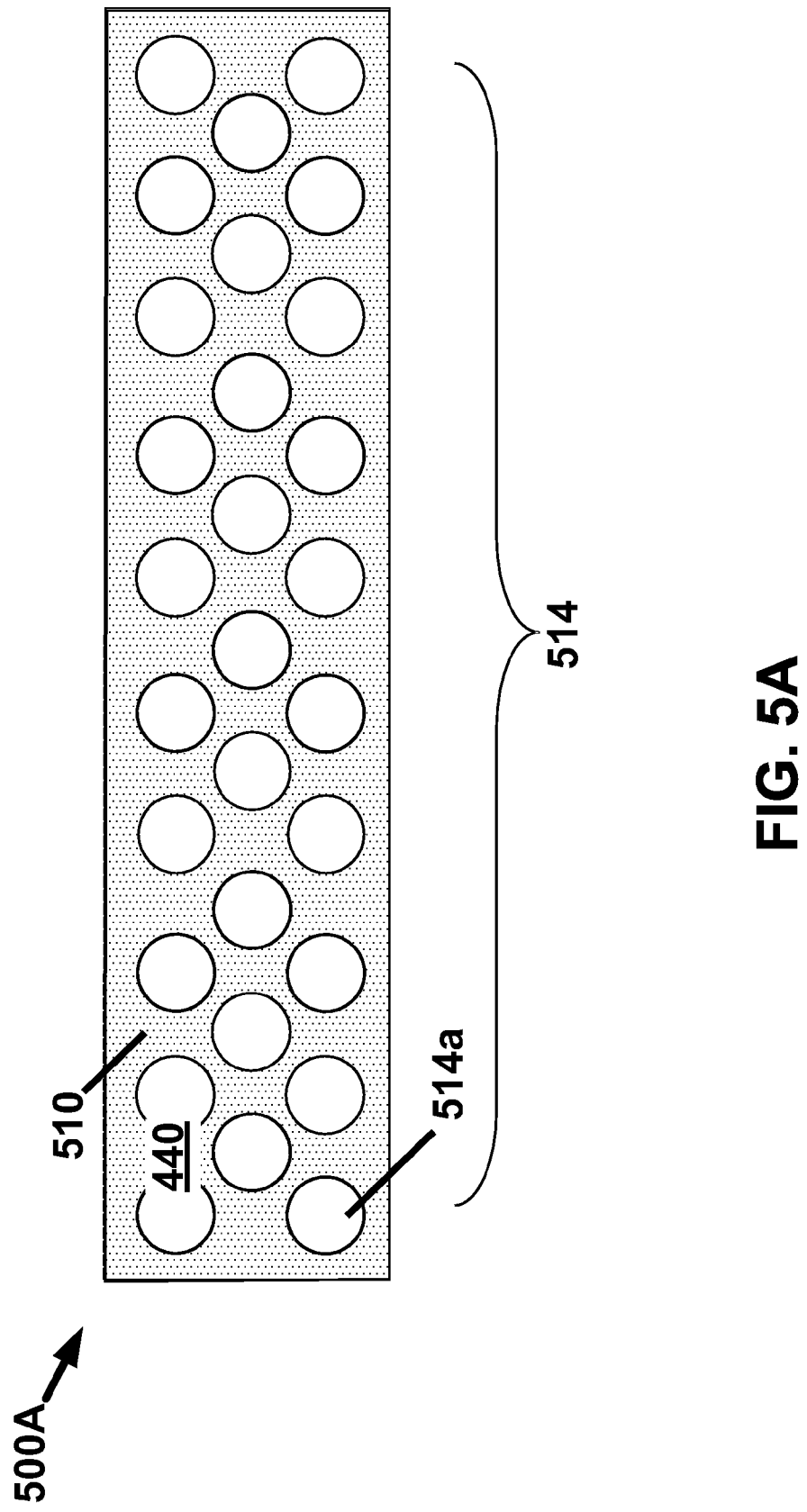
FIG. 5A is a plan view of the section through the trace of plane 5A-5A of FIG. 4B of a first example luminescence enhancement structure including a thin-film metallic layer patterned with a two-dimensional plurality of voids, in an embodiment of the present invention.
Figure 5B:
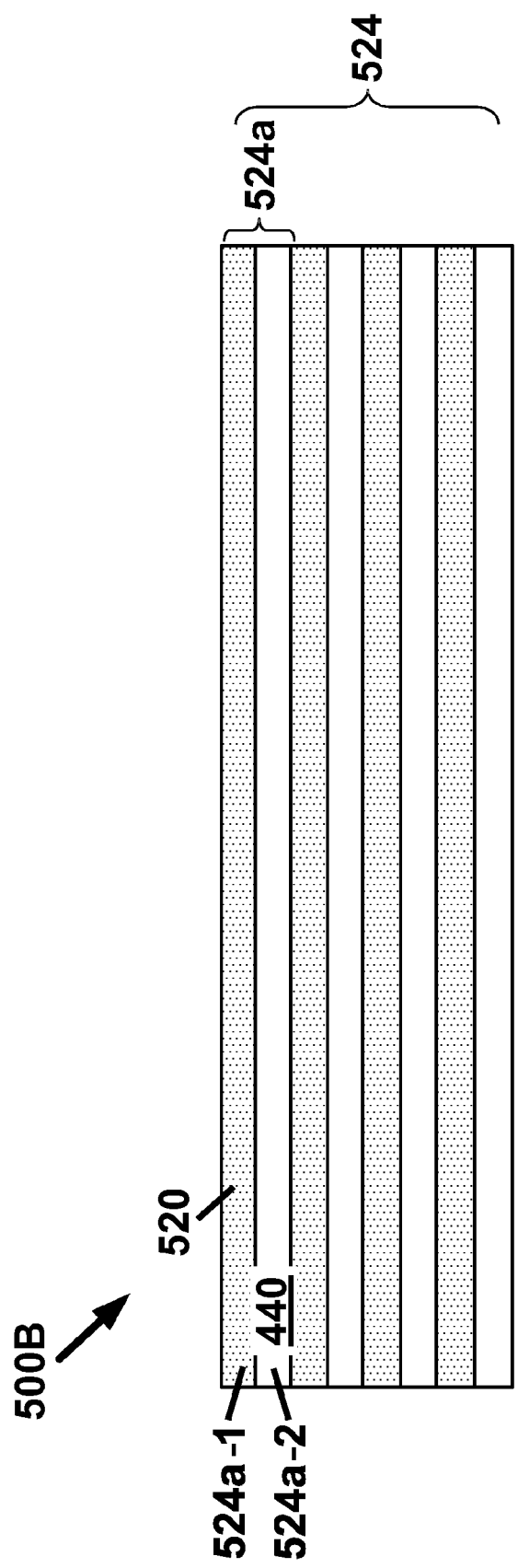
FIG. 5B is a plan view of the section through the trace of plane 5A-5A of FIG. 4B of a second example luminescence enhancement structure including a thin-film metallic layer patterned in a form of a plurality of one-dimensional metallic wires, in an embodiment of the present invention.
Figure 5C:
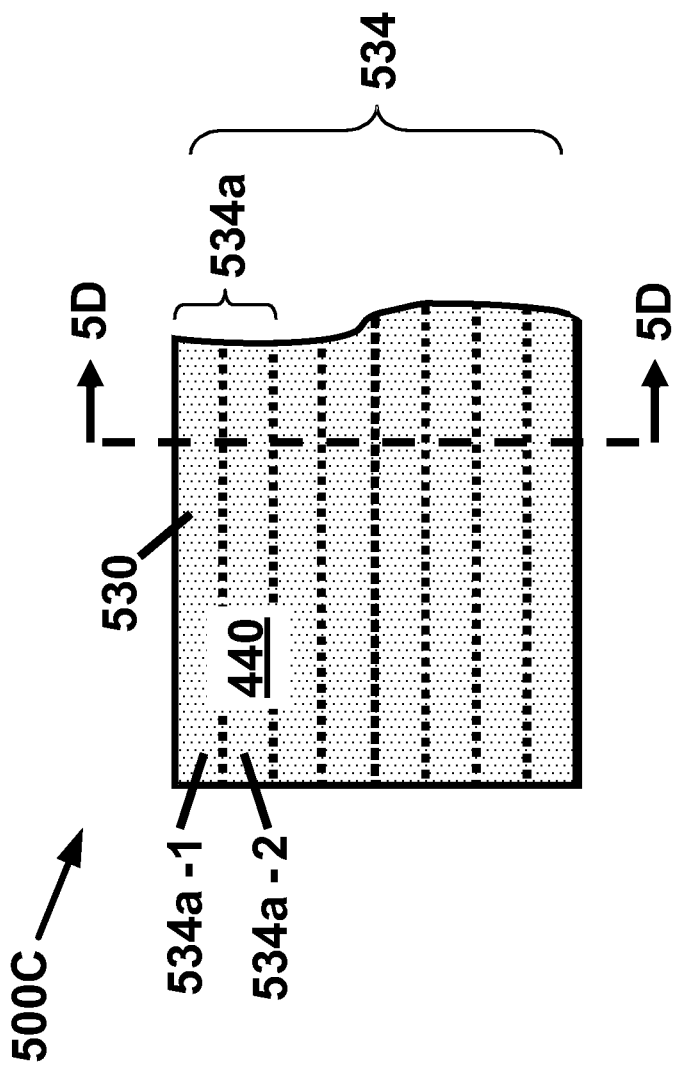
FIG. 5C is a plan view of the section through the trace of plane 5A-5A of FIG. 4B of a third example luminescence enhancement structure including a thin-film metallic layer patterned in a form of a plurality of corrugations, in an embodiment of the present invention.

With reference now to FIGS. 5A-5C, in accordance with other embodiments of the present invention, plan views 500A, 500B and 500C of the section through the trace of plane 5A-5A of FIG. 4B of various examples of the luminescence enhancement structure 440 are shown. In accordance with embodiments of the present invention, the luminescence enhancement structure 440 further includes a structure selected from the group consisting of a thin-film metallic layer 510 patterned with a two-dimensional plurality 514 of voids, of which void 514a is an example, a thin-film metallic layer 520 patterned in a form of a plurality 524 of one-dimensional of metallic wires, of which metallic wire 524a-1 is an example, a thin-film metallic layer 530 patterned in a form of a plurality 534 of corrugations, of which corrugation 534a is an example, and at least one thin-film metallic layer including a portion of a cavity structure as previously described in the discussion of FIG. 4A. As shown in FIG. 5A, in one embodiment of the present invention, the luminescence enhancement structure 440 includes the thin-film metallic layer 510 patterned with the two-dimensional plurality 514 of voids, of which void 514a is an example. As shown in FIG. 5B, in another embodiment of the present invention, the luminescence enhancement structure includes the thin-film metallic layer 520 patterned in the form of the plurality 524 of one-dimensional of metallic wires, of which metallic wire 524a-1 is an example; the metallic wires are separated from one another by gaps in the thin-film metallic layer 520, of which gap 524a-2 is an example. In another embodiment of the present invention, the metallic wire 524a-1 may include a strip of the thin-film metallic layer 520 separated from another strip of the thin-film metallic layer 520 by the gap 524a-2. As shown in FIG. 5C, in another embodiment of the present invention, the luminescence enhancement structure 440 includes the thin-film metallic layer 530 patterned in the form of the plurality 534 of corrugations, of which corrugation 534a is an example; corrugation 534a includes a first portion 534a-1 and a second portion 534a-2. A cutting plane 5D-5D through the luminescence enhancement structure 440 is also shown in FIG. 4C, which provides a cross-sectional elevation view of the structure of the luminescence enhancement structure 440 of FIG. 5C, which is next described.

Figure 5D:
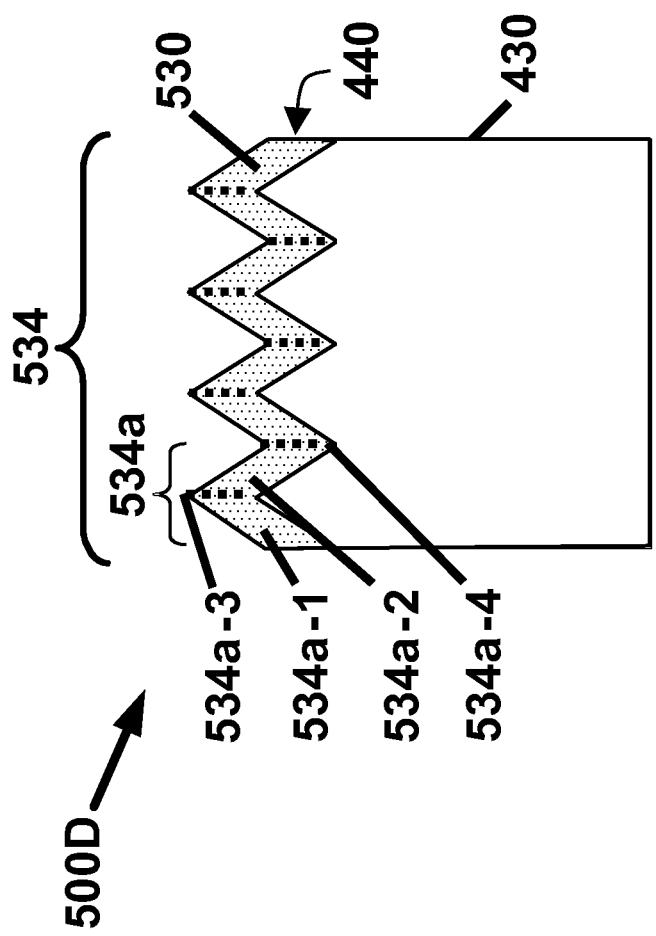
FIG. 5D is a cross-sectional elevation view of the section through the trace of plane 5D-5D of FIG. 5C of the third example luminescence enhancement structure including a thin-film metallic layer patterned in the form of the plurality of corrugations, in an embodiment of the present invention.

With reference now to FIG. 5D, in an embodiment of the present invention, a cross-sectional elevation view 500D of the section through the trace of plane 5D-5D of FIG. 5C of the luminescence enhancement structure 440 is shown; first and second portions 534a-1 and 534a-2 are joined at an apex 534a-3 of the corrugation 534a; and, adjacent corrugations may be joined with one another at troughs, of which trough 534a-4 is an example. In an embodiment of the present invention, as shown in FIG. 5D, the thin-film metallic layer 530 may disposed on an n-doped portion 430 of the SiGe, QW LED 120 that has been provided with an undulating surface topography, by way of example without limitation thereto, which provides a template for the growth of the thin-film metallic layer 530 that is replicated in the corrugated structure of the luminescence enhancement structure 440.

With further reference to FIGS. 5A-5D, in accordance with embodiments of the present invention, the total power, $W_{tot}$, that is consumed by the SiGe, QW LED 120 is given by: $W_{tot}=IV$, where V is the voltage 492, and I is the current 488 applied to the SiGe, QW LED 120; for V=1 V and I=10 mA, the total power, $W_{tot}=10$ mW. In accordance with embodiments of the present invention, neglecting the effects of the luminescence enhancement structure 440 described above, radiation power, $W_{rad}$, that is radiated by the SiGe, QW LED 120 is given by: $W_{rad}=\eta W_{tot}$, where $\eta$ is the intrinsic radiation efficiency; for $W_{tot}=10$ mW and $\eta=1\times10^{-3}$, the radiation power, $W_{rad}=1\times10^{-3}$ W. The intrinsic radiation efficiency, $\eta$, is given by:

$$\eta = W_{rad}/W_{tot} = \nu_{rad}/(\nu_{12}+\nu_{rad}) \cong \tau_{12}/\tau_{rad},$$

where $\nu_{rad}$ is the radiative recombination rate and, correspondingly, $\tau_{rad}$ is the transition time for radiative recombination; $\nu_{12}$ is the non-radiative recombination rate and, correspondingly, $\tau_{12}$ is the transition time for non-radiative recombination.

With further reference to FIGS. 5A-5D, in accordance with embodiments of the present invention, a large increase in radiation efficiency can be obtained using the luminescence enhancement structure 440 through the action of surface plasmons present in the metallic layer of the luminescence enhancement structure 440. Since the intrinsic radiation efficiency, $\eta$, is low $\eta=1\times10^{-3}$, for embodiments of the present invention without the aid of the luminescence enhancement structure 440 described above, the intrinsic radiation efficiency, $\eta$, may be dramatically increased by coupling the emitter to surface plasmons in the vicinity of the emitting region, which includes the carrier confinement region within the second QW portion 420b. The proximity to metal increases spontaneous emission; and, coupling to electron oscillations, or surface plasmons, in the metal may be efficient in increasing the radiation rate. The effect has been demonstrated with the use of one-dimensional gratings, two-dimensional corrugated silver films, and cavity-like structures. Thus, for embodiments of the present invention, a new decay channel into surface plasmons modes appears with the surface-plasmon-assisted radiative recombination rate, $\nu_{SP}$, and the correspond transition time for surface-plasmon-assisted radiative recombination, $\tau_{SP}$, given by:

$$\nu_{SP}=\tau_{SP}^{-1}=F_P\tau_{rad}^{-1},$$

where $F_P$ is the Purcell factor. In one embodiment of the present invention, surface plasmons may be coupled into radiative modes by a grating, which may be provided by the luminescence enhancement structure 440 described above. This radiative process, characterized by coupling strength, $\kappa$, competes with non-radiative Ohmic losses in the metal, characterized by the imaginary part of surface plasmons propagation constant, $\beta_P''$. Hence, no matter the Purcell factor, the enhancement is limited by the ratio of surface plasmons radiative coupling efficiency to the original efficiency of the source. Thus, in accordance with embodiments of the present invention, when the intrinsic radiation efficiency, $\eta$ is low, viz. $\eta=0.1\%$, then radiation efficiency may be increased by a plasmonic grating by one to two orders of magnitude, depending on the collection geometry. In another embodiment of the present invention, a perforated, or alternatively, patterned, silver thin-film may be used as the luminescence enhancement structure 440, which also may provide a top electrode of the SiGe, QW LED 120, instead of a direct contact 482 to, for example, the n-doped portion, as shown in FIGS. 4A and 4B. For example, in another embodiment of the present invention, a two-dimensional array of voids in a silver thin-film may be used as the luminescence enhancement structure 440; or alternatively, a one-dimensional array of silver wires, which may also serve as a one-dimensional optical coupling grating, may be used as the luminescence enhancement structure 440. However, the enhancement due to the surface plasmons practically vanishes if the original efficiency exceeds $\eta=10\%$.

Thus, in accordance with an embodiment of the present invention, if the light collector 450 that is optically coupled with a light modulator, for example, similar to light modulator 130, is monolithically integrated on the SiGe, QW LED 120, as shown in FIG. 4B, the SiGe, QW LED 120 may generate light in the continuous wave (CW) regime, which may be modulated by an integrated modulator, for example, similar to light modulator 130, with a speed sufficient for communication between ICs. The radiative emission should have a standard speed for direct transitions with a frequency, $\tau^{-1}$, greater than or equal to 3-5 giga-Hertz (GHz). The SiGe, QW LED 120 can be used as a source of CW radiation that can be coupled by a grating to an adjacent integrated modulator, for example, a ring, or alternatively a Mach-Zehnder interferometer, for producing the modulated light signal, for example, the modulated light signal, represented by the photon of light 154 of FIG. 1, at a desired frequency. Moreover, the design of the SiGe, QW LED 120 could be optimized for a particular operational wavelength, for example, 850 nm, by suitable choice of materials, circuit layout and integration scheme. Thus, the SiGe, QW LED 120 may provide a source of CW radiation that is tunable to a desired frequency, for example, 850 nm; and, being based on the SiGe, QW LED 120 would be compatible with Si-based CMOS technology and monolithically integrable with light modulators and optical waveguides based on silicon-on-insulator (SOI) technology to provide optical output drivers for optical interconnection and communication between ICs.

The foregoing descriptions of specific embodiments of the present invention have been presented for purposes of illustration and description. They are not intended to be exhaustive or to limit the technology to the precise forms disclosed, and many modifications and variations are possible in light of the above teaching. The embodiments described herein were chosen and described in order to best explain the principles of the technology and its practical application, to thereby enable others skilled in the art to best utilize the technology and various embodiments with various modifications as are suited to the particular use contemplated. It may be intended that the scope of the technology be defined by the claims appended hereto and their equivalents.

What is claimed is:

1. A silicon-germanium, quantum-well, light-emitting diode comprising:
    a p-doped portion, a quantum-well portion, and a n-doped portion, said quantum-well portion disposed between said p-doped portion and said n-doped portion;
    wherein said quantum-well portion comprises a carrier confinement region configured to facilitate luminescence with emission of light produced by direct recombination of an electron with a hole confined within said carrier confinement region;
    wherein said p-doped portion comprises a first alloy of silicon-germanium, and said n-doped portion comprises a second alloy of silicon-germanium.

2. The light-emitting diode of claim 1, wherein said quantum-well portion further comprises:
    a first quantum-well portion, a second quantum-well portion, and a third quantum-well portion, said second quantum-well portion comprising said carrier confinement region and disposed between said first quantum-well portion and said third quantum-well portion;
    wherein said first quantum-well portion comprises a third alloy of silicon-germanium, said second quantum-well portion comprises a fourth alloy of silicon-germanium, and said third quantum-well portion comprises a fifth alloy of silicon-germanium.

3. The light-emitting diode of claim 2, wherein a composition of said fourth silicon-germanium alloy is adjusted to provide a bandgap at the $\Gamma$-point of said fourth silicon-germanium alloy for production of light with a wavelength between about 850 nm and about 1550 nm.

4. The light-emitting diode of claim 2, wherein a composition of said fourth silicon-germanium alloy is adjusted to produce light with a wavelength of about 850 nm.

5. The light-emitting diode of claim 1, wherein said p-doped portion, said quantum-well portion, and said n-doped portion are configured to facilitate Auger recombination in an Auger transition in said carrier confinement region of said quantum-well portion and production of carriers at the $\Gamma$-point for said direct recombination of an electron with a hole confined within said carrier confinement region.

6. The light-emitting diode of claim 1, wherein said p-doped portion, said quantum-well portion, and said n-doped portion are configured to produce an accumulation of an injected hole in said carrier confinement region when biased in a forward bias condition.

7. The light-emitting diode of claim 1, further comprising:
    a luminescence enhancement structure comprising a thin-film metallic layer coupled with said quantum-well portion and configured to facilitate said direct recombination of an electron with a hole confined within said carrier confinement region through the action of surface plasmons present in said metallic layer.

8. The light-emitting diode of claim 7, wherein said thin-film metallic layer comprises a metal selected from the group consisting of silver, gold, aluminum and copper.

9. The light-emitting diode of claim 7, wherein said luminescence enhancement structure further comprises a structure selected from the group consisting of a thin-film metallic layer patterned with a two-dimensional plurality of voids, a thin-film metallic layer patterned in a form of a plurality of one-dimensional of metallic wires, a thin-film metallic layer patterned in a form of a plurality of corrugations and at least one thin-film metallic layer comprising a portion of a cavity structure.

10. The light-emitting diode of claim 7, further comprising:
    a light collector, said light collector optically coupled with said luminescence enhancement structure and configured for collecting emitted light.

11. A combined silicon-germanium, quantum-well, light-emitting diode and light modulator device, said device comprising:
    a silicon-germanium, quantum-well, light-emitting diode integrated with said light modulator, said silicon-germanium, quantum-well, light-emitting diode comprising:
        a p-doped portion, a quantum-well portion, and a n-doped portion, said quantum-well portion disposed between said p-doped portion and said n-doped portion;

wherein said quantum-well portion comprises a carrier confinement region configured to facilitate luminescence with the emission of light produced by direct recombination of an electron with a hole confined within said carrier confinement region;

wherein said p-doped portion comprises a first alloy of silicon-germanium, and said n-doped portion comprises a second alloy of silicon-germanium; and a light modulator optically coupled with said silicon-germanium, quantum-well, light-emitting diode.

12. The device of claim 11, further comprising:

a luminescence enhancement structure comprising a thin-film metallic layer coupled with said quantum-well portion and configured to facilitate said direct recombination of an electron with a hole confined within said carrier confinement region through the action of surface plasmons present in said metallic layer.

13. The device of claim 11, further comprising:

a light collector, said light collector disposed between and optically coupled with a luminescence enhancement structure and said light modulator.

14. A combined silicon-germanium, quantum-well, light-emitting diode, light modulator and integrated-circuit device, said device comprising:

an integrated-circuit; and a combined silicon-germanium, quantum-well, light-emitting diode and light modulator device, said device comprising:

a silicon-germanium, quantum-well, light-emitting diode integrated with said light modulator, said silicon-germanium, quantum-well, light-emitting diode comprising:

a p-doped portion, a quantum-well portion, and a p-doped portion, said quantum-well portion disposed between said p-doped portion and said n-doped portion;

wherein said quantum-well portion comprises a carrier confinement region configured to facilitate luminescence with the emission of light produced by direct recombination of an electron with a hole confined within said carrier confinement region;

wherein said p-doped portion comprises a first alloy of silicon-germanium, and said n-doped portion comprises a second alloy of silicon-germanium; and a light modulator optically coupled with said silicon-germanium, quantum-well, light-emitting diode;

wherein said light modulator is configured to receive a signal from said integrated circuit for modulating emitted light.

15. The device of claim 14, wherein said integrated circuit further comprises a complementary-metal-oxide-semiconductor (CMOS) silicon integrated circuit.

* * * * *

UNITED STATES PATENT AND TRADEMARK OFFICE
CERTIFICATE OF CORRECTION

| | | |
|---|---|---|
| PATENT NO. | : 8,476,647 B2 | Page 1 of 1 |
| APPLICATION NO. | : 13/259455 | |
| DATED | : July 2, 2013 | |
| INVENTOR(S) | : Alexandre M. Bratkovski et al. | |

It is certified that error appears in the above-identified patent and that said Letters Patent is hereby corrected as shown below:

On the title page, item (57), Abstract, in column 2, line 9, before "with" insert -- of an electron --.

Signed and Sealed this
Fifth Day of November, 2013

Teresa Stanek Rea
*Deputy Director of the United States Patent and Trademark Office*